United States Patent [19]
Palecek

[11] 3,953,101
[45] Apr. 27, 1976

[54] ELECTRICAL CONNECTOR ASSEMBLIES

[75] Inventor: Vincent James Palecek, Cicero, Ill.

[73] Assignee: Bunker Ramo Corporation, Oak Brook, Ill.

[22] Filed: May 12, 1975

[21] Appl. No.: 576,510

Related U.S. Application Data

[63] Continuation of Ser. No. 196,022, Nov. 5, 1971, abandoned.

[52] U.S. Cl............................. 339/174; 339/17 CF
[51] Int. Cl.² .................. H01R 13/50; H01R 13/64
[58] Field of Search...................... 174/DIG. 3, 68.5; 317/101 A, 101 C, 101 CC, 101 D; 339/17, 112 R, 174, 176 M, 184 M

[56] References Cited
UNITED STATES PATENTS

| | | | |
|---|---|---|---|
| 3,391,383 | 7/1968 | Antes............................. | 339/17 CF |
| 3,409,861 | 11/1968 | Barnes............................ | 339/17 CF |
| 3,464,054 | 8/1969 | Mansfield......................... | 339/17 L |
| 3,753,211 | 8/1973 | Pavza............................. | 339/17 CF |
| 3,754,203 | 8/1973 | Pavza............................. | 339/17 CF |

*Primary Examiner*—Roy Lake
*Assistant Examiner*—Mark S. Bicks
*Attorney, Agent, or Firm*—William Lohff; F. M. Arbuckle

[57] ABSTRACT

Electrical connector assemblies in which a flat, leadless integrated circuit package with a ceramic body and conductive pads thereon is rearwardly received on an insulating base means and the conductive pads are interconnected under high unit pressure with active portions of contact means disposed on the base means wherein the pressure engagement of the active portions provides at least partial support for the package. Initially, free-ended active portions of the contact means extend frontwardly from mounting portions fixably positioned in the base means, and are movable rearwardly with lateral deflection by cantilever spring means interconnecting the active and mounting portions, the rearward movement developing a high unit pressure between the active portions and pads and the lateral deflection providing a wiping action on the conductive pads. Free ends of the active portions are resiliently rearwardly restrained in the base means and provide a frontward biasing means for additional development of high unit pressure during initial rearward movement of the conductive pads and active portions in engaging relationship. Polarizing pins disposed on the base means and engageable with the package act to restrain the package against lateral displacement during wiping action of the active portions. The package is held on the base means by cover means having a common end with one end of the base means and integrally hinged thereto.

11 Claims, 11 Drawing Figures

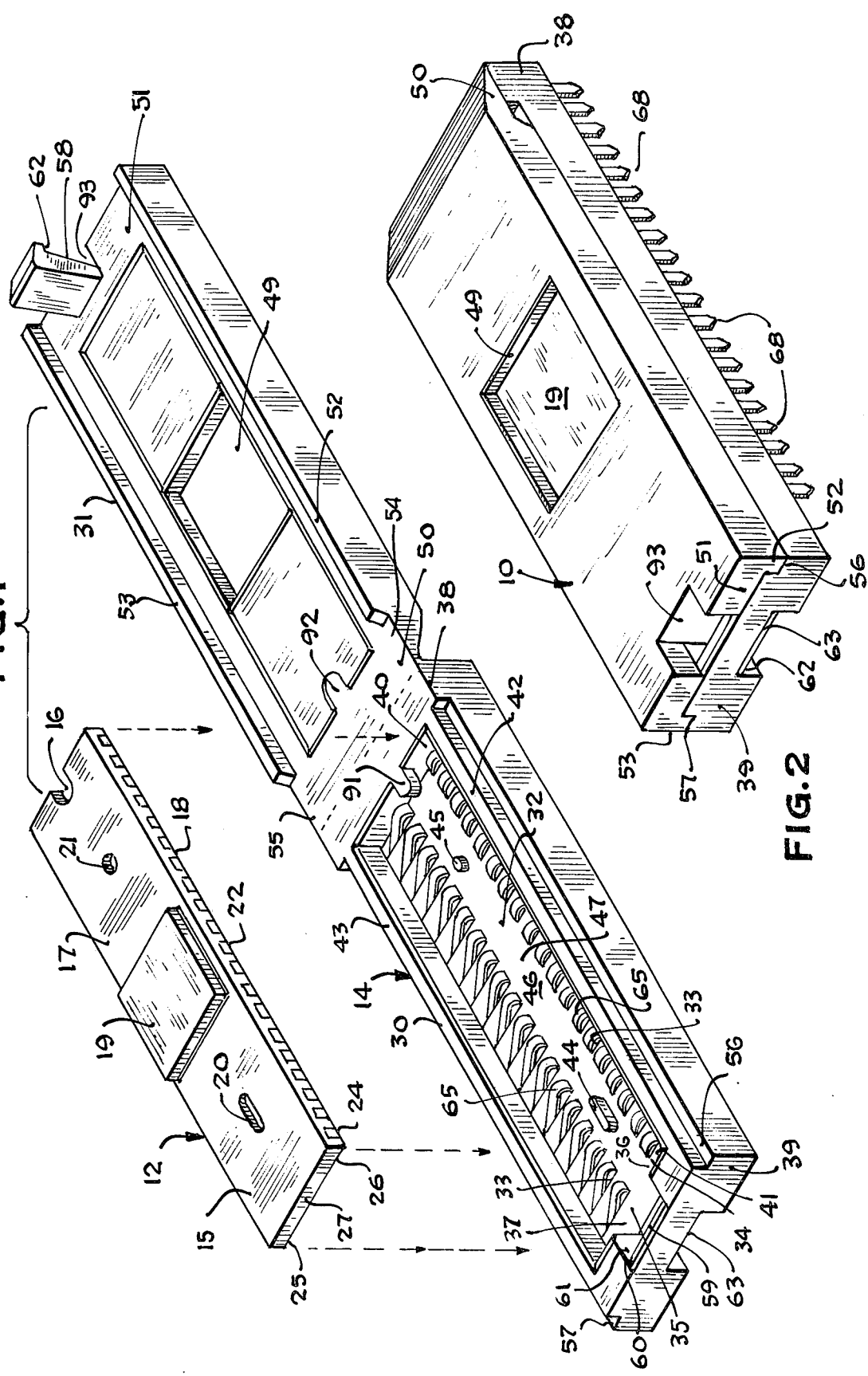

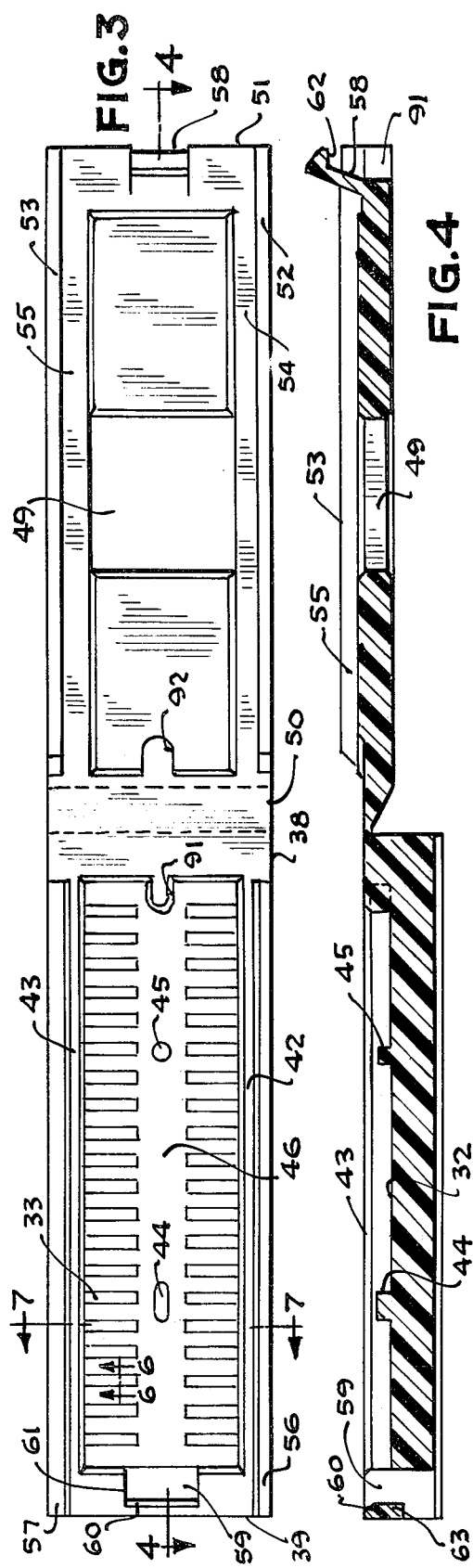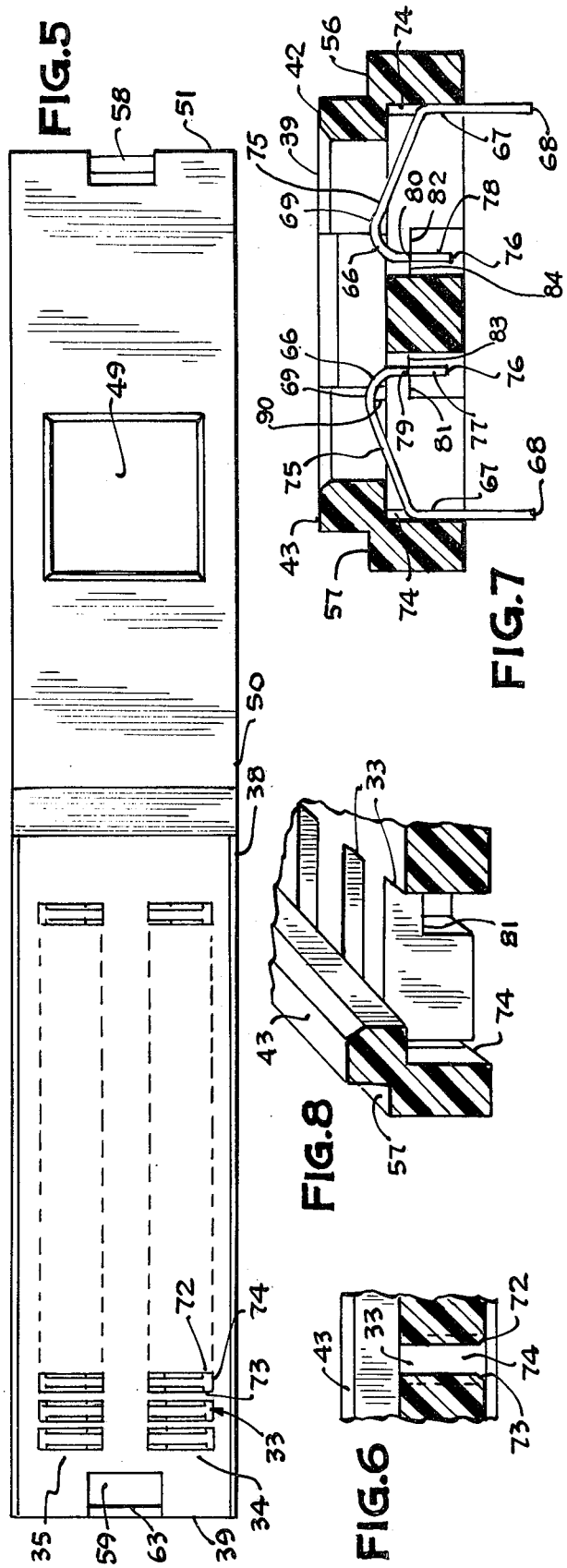

ELECTRICAL CONNECTOR ASSEMBLIES

This is a steamlined continuation of, application Ser. No. 196022, filed Nov. 5, 1971, now abandoned.

BACKGROUND OF THE INVENTION

Integrated circuits are generally supplied in packages in which a ceramic body formed of one or more layers supports a circuit chip and includes a plurality of external metallic leads electrically interconnected to the circuit chip. One common type is the dual-in-line package in which thin leads protrude from opposite sides of the package and then are bent at right angles in a common direction. By way of example, twenty leads may protrude from each side in a forty lead package and are bent to extend in a rearward direction. Such packages are difficult to manufacture since bending of the leads can cause breakage and rejection of many packages. Leads may also be broken during testing and shipping, even though installed in a protective carrier, and also easily damaged in installation before use. Since the integrated circuit packages with their circuit chips are expensive, such problems are of a serious nature.

Another more recent type of package utilizes conductive pads along one edge and is vertically insertable a short distance into a slot of an edge-mount connector. In this combination forming an electrical module, the edge of the flat package rather than external leads provide some physical support for the package plus conductive elements for engagement with contacts in the connector. While these edge-mount packages do not have the problems associated with external leads, they are usually very thin, quite brittle and can be damaged unless adequately supported.

Also, since the edge-mount package engages the contact of the connector at a single edge, it is usually necessary to interconnect the centrally mounted circuit chip to individual conductive pads at that edge, resulting in problems in the design of a pattern of interconnecting conductors, a lengthy package with lengthy interconnecting conductors, and the possibility of increased electrical interaction between interconnecting conductors.

Another problem with many integrated circuit packages involves warpage and other permanent distortion developed during manufacturing operations which can cause them to become slightly bowed in respect to a planar surface. Since the packages are usually of brittle construction, they can be damaged unless adequately supported. Under these circumstances, support for the packages by the usual coplanar supporting surfaces is not always satisfactory.

Therefore it is desirable that new integrated circuit connectors in combinations with integrated circuit packages be developed.

SUMMARY

This invention involves the use of a flat, leadless integrated circuit package including a centrally mounted circuit chip and a rearwardly directed major surface on which thin conductive pads are electrically connected to the chip and extend outwardly over portions of the major surface. Connector means are provided for rearwardly receiving the integrated circuit package with the contact means including frontwardly extending, rearwardly yieldable active portions positioned for engagement with the conductive pads on the package. Rearward movement of the package is operative to move the pads into engagement with the active portions of the contact means and cause the active portions to yield rearwardly. During the rearward yielding of the active portions, high-unit contact pressures are developed between the active portions and the pads, thereby providing good electrical connections and insuring electrical engagement with pads displaced from a planar surface by the distortion of the package.

The high-unit pressures developed by the pressure-developing means also permits the use of the contact means for at least partial rearward support of the integrated circuit package with such support conforming to any distortion in the major surface of the package and being uniformly distributed thereon. The connector means also includes lateral deflection means which act under high-unit contact pressure to effect a lateral movement of the active portions on the pads, thereby providing a wiping action. The package is held in position on the connector by cover means frontwardly extending over the package and releasably fastened to the insulating base means of the connector.

One of the several advantages associated with the connector assembly of the invention is that conductive pads can extend along more than one side of the integrated circuit package and are engageable by contacts in the connector. In this arrangement, the pads can be formed in a pattern which utilizes relatively short pad lengths and thereby limits the possibility of electrical interaction between interconnecting conductors. Another advantage is provided by the distribution of rearwardly yielding active portions of the contact means over sufficient individual contact areas of the package to provide uniformly distributed support for the package. A further advantage is associated with the active portions of the contact means extending frontwardly a sufficient length to electrically engage conductive pads which are on a distorted major surface of the package.

DESCRIPTION OF THE DRAWING

FIG. 1 is an isometric view illustrating an electrical connector assemby according to the invention with the integrated circuit package being separated from the connector to illustrate further details.

FIG. 2 is an isometric view of the electrical connector assemby of FIG. 1 with the cover closed over the integrated circuit package.

FIG. 3 is a front view of the electrical connector of FIG. 1 prior to insertion of the metallic contacts in the connector.

FIG. 4 is a side view in cross-section along line 4—4 of the connector of FIG. 3.

FIG. 5 is a rear view of the electrical connector of FIG. 1 also without the metallic contacts being inserted.

FIG. 6 is an enlarged fragmental side view in cross-section of one of the contact-receiving bores of FIG. 3 and taken along line 6—6.

FIG. 7 is an enlarged end view in cross-section along line 7—7 of FIG. 3 except that the contacts are shown in their mounted position prior to mounting of the integrated circuit package.

FIG. 8 is a fragmental view of FIG. 7 without the metallic contacts.

DETAILED DESCRIPTION

Figure 10:
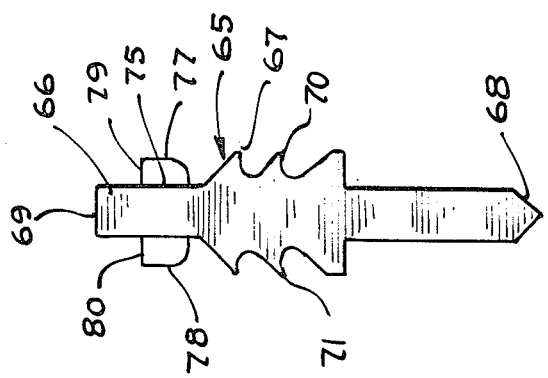
FIG. 10 is an enlarged end view of the electrical contact illustrated in side view in FIG. 7.

The electrical connector assembly of the invention includes a flat integrated circuit package with a centrally positioned circuit chip, opposed major surfaces with one of such surfaces being rearwardly directed, and a plurality of thin conductive pads interconnected to the circuit chip and extending over portions of the rearwardly directed major surface.

The integrated circuit package is rearwardly receivable in a connector means including an insulating base means with a front face for receiving in juxtaposition the rearwardly directed major surface of the package, a plurality of resilient metallic contact means disposed on the front face including yieldable active portions frontwardly disposed therefrom, and pressure-developing means operative to response to a portion of rearward movement of the package and the pads against the active portions of the contact means to develop a pressure engagement between the active portions and the pads.

An additional feature of the connector is lateral deflection means operative during rearward movement of the active portions to laterally move the active portions across their respective pads and thereby provide a wiping action to remove oxides and other insulation-forming materials. Advantageously, the contact means includes mounting portions fixably positioned in the base means, and cantilever spring means which interconnect the mounting and active portions to provide both pressure-developing means and lateral deflection means to move the active portions both rearwardly and laterally during rearward movement of the pads against the active portions. Also, advantageously, the pressure-developing means includes biasing means resiliently restraining the active portions rearwardly from free forward positioning in respect to the front face prior to rearward movement of the package. The biasing means aids in developing high-unit contact pressures during initial rearward movement of the pads against the active portions and thereby improves the effectiveness of the lateral wiping action.

In accordance with an additional specific feature, the front face includes a plurality of contact-receiving bores which extend rearwardly from the front face with the contact means being partially positioned in the bores and having their active portions extending frontwardly therebeyond.

In a further specific feature restraining means are provided on the connector for restraining the rearwardly directed major surface of the package from lateral displacement during rearward movement of the pads against the active portions and the occurrence of the wiping action.

Holding means are provided for holding the rearwardly directed major surface of the package in juxtaposition to the front face and maintaining pressure engagement between the active portions of the contact means and the conductive pads of the package. Advantageously, the holding means includes cover means integrally interconnected to the base means and having sufficient resiliency to fit over any distortion in the front major surface of the integrated circuit package. In those instances where the integrated circuit package includes a frontwardly extending projection housing or otherwise protecting the circuit chip and active semi-conductor circuit elements thereon, the cover means includes an opening exposing the frontwardly extending projection to permit air cooling and identification of the package.

As illustrated in FIGS. 1–2, reference numeral 10 generally designates an electrical connector assembly construction in accordance with the principles of this invention, comprising a generally flat integrated circuit package 12 and connector means 14 with the package being positioned for rearward movement and mounting in connector 14. Integrated circuit package 12 comprises an insulating body 15 of ceramic material with opposed major surfaces 17–18, frontwardly extending projection 19, polarizing apertures 16 and 20–21, and conductive pads 22. As further illustrated in FIG. 9, the conductive pads 22 are arranged in two parallel rows 23–24 extending longitudinally along outer surfaces 25–26 and separated by central strip 27 on rearwardly directed major surface 18. Although pads 22 are illustrated extending from central strip 27 laterally outwardly towards surfaces 25–26, it is understood that other patterns of conductive pads electrically extending from the circuit chip can be utilized. As illustrated, the conductive pads 22 are separated on major surface 18 and project slightly rearwardly therebeyond.

Pads 22 are electrically interconnected to an integrated circuit chip (not illustrated) disposed within the frontwardly extending projection 19 on frontwardly direction major suface 17. The details of the internal construction of projection 19, package 12, and electrical interconnections between pads 22 and the circuit chip are not shown, but it will be understood that package 12 may be fabricated in layers using fabrication procedures known in the semi-conductor art and that electrical connections between circuit chip and the conductive pads may be made by known techniques.

Although as illustrated, conductive pads 22 are primarily positioned on rearwardly directed major surface 18, additional conductive pads may be positioned on frontwardly directed major surface 17 and electrically interconnected to contact means provided in the connector means.

In respect to the terms used herein, such as frontwardly, rearwardly, horizontal, vertical, outwardly, inwardly, and the like, it is understood that these are used for ease of description and clarity only and are not to be construed as limitations since the positioning of connector means 14 is not critical.

As illustrated in FIGS. 1–9, connector means 14 include base means 30 and integrally-hinged cover means 31 for holding package 12 in connector 14. Suitably, connector 14 is molded of polypropylene, nylon or other resilient insulating material which advantageously permits the integral interconnection between base means 30 and cover means 31. In this manner, a mating cover is always provided with each connector 14 and the connector can be opened numerous times without the cover being misplaced or lost.

The insulating base means 30 includes front face 32 and a plurality of contact-receiving bores 33 extending in two parallel rows 34–35 longitudinally along outer side surfaces 36–37. Base means 30 also includes first and second respective ends 38–39 with frontwardly extending endwalls 40–41, and sidewalls 42–43 which extend frontwardly from side surfaces 36–37. Unequally sized polarizing pins 44–45 and projection 91 are disposed on front central strip 46 and frontwardly extend therefrom and insertable in apertures 20–21 and 16 for restraining package 12 from lateral displacement during the wiping action on conductive pads 22. As illustrated, endwalls 40–41 and sidewalls 42–43 from package-receiving cavity 47 for receiving package 12.

Cover means 31 is generally rectangular and includes central opening 49 to receive frontward projection 19 of package 12 for cooling and identification purposes, and further includes first and second respective ends 50–51 with end 50 being integrally hinged to end 38 of base means 30. Rearwardly extending sidewalls 52–53 are provided on sides 54–55 of cover means 31 to be placed in juxtaposition with shoulders 56–57 of base means 30. On ends 39 and 51 opposite common ends 38 and 50 are respectively provided latch means 58 and opening 50 to releasably fasten cover means 31 to base means 30. With resilient materials such as polypropylene and nylon, latch means 58 can be integrally molded on cover means 31 and inwardly deflectable by step means 60 provided in notch 61 of end 39. After shoulder 62 passes rearwardly beyond step means 60, it resiliently moves outwardly and engages undercut portion 63 of end 39 to retain cover means 31 and hold package 12 in juxtaposition with front face 32. Notch 93 is provided in cover means 31 to aid in the flexing of latch 58.

As particularly illustrated in FIGS, 1–2, 7, and 9–10, connector means 14 also includes a plurality of metallic contact means 65 disposed on front face 32 and arranged in two parallel groups for coacting with pads 22 on package 12. One of the contact means 65 is illustrated in FIGS. 7 and 10 and is constructed of strip material beryllium copper alloy or other resilient and highly conductive material which is plated with a thin layer of gold to lower contact resistance. The thickness of metal may be about 0.006 inches while the width may be about 0.034 inches except in thos portions which are enlarged for mounting and biasing purposes. The contact means 65 includes an upper active portion 66 rearwardly yieldable by engagement with pad 22, an intermediate mounting portion 67 for fixably positioning contact means 65 in base means 30, and a lower terminal portion 68 for electrical connection to external conductors (not shown). Active portion 66 is free-ended in respect to mounting portion 67 and is rounded at frontwardly projection surface 69 which has a radius in the order of about 0.031 inches.

Mounting portion 67 includes laterally extending opposite barbs 70–71 to bite into surfaces 72–73 of groove 74 (FIGS. 5–7 and 10) during rearward mounting of the contact means 65. Bore 33 is sized to enable active portion 66 to frontwardly extend beyond front face 32 a length 90 of about 0.035 inches to engagingly receive pad 22 and to be rearwardly deflectable thereby.

Pressure-developing means are provided by resilient support means which support active portion 66 and develop pressure during rearward movement thereof. As illustrated, pressure-developing means includes catilever spring means 75 interconnecting active and mounting portions 66–67 and which during rearward movement of active portion 66, acts to increase contact pressure between active portion 66 and conductive pad 22. As illustrated in FIG. 7, cantilever spring means 75 is inclined frontwardly and extends laterally from mounting portion 67 to active portion 66.

In addition to permitting rearward movement of active portion 66, cantilever spring means 75 also acts as a lateral deflection means to move active portion 66 laterally under substantial contact pressure and provide a wiping action on conductive pad 22. The means for developing pressure also incldues a biasing means to frontwardly bias active portion 66 and thereby increase the contact pressure during initial rearward movement of active portion 66 in engagment with pad 22. In respect to illustrated contact means 65, the biasing is provided by a rearward bend on end 76 which includes laterally extending opposite flanges 77–78 with front shoulders 79–80 for abutting engagement with undercut portions 81–82 in bore 33. During mounting of contact means 65, shoulders 79–80 engage undercut portions 81–82 prior to final forward positioning of mounting portion 67 and restrain active portion 66 from free forward positioning in respect to front face 32. When lateral movement of active portion 66 is intended, shoulders 79–80 engage portions 81–82 intermediate their inner ends 83–84 to permit lateral deflection of shoulders 79–80 during the wiping action of active portion 66 on pad 22 to effectively remove any undesirable insulative oxide coating on pad 22.

In respect to contact means 65 as illustrated, end 75 may be about 0.030 inches, flange 77 may be 0.030 inches by 0.018 inches, the length of mounting portion 67 may be about 0.091 inches, and the length of terminal portion 68 may be about 0.130 inches. These dimensions together with those previously provided are not critical and are not to be construed as limitations, except that it is important to properly proportion the dimensions of the contact means in relation to the resiliency of the material, to obtain the operations described herein.

FIGS. 6 and 8 provide further details of bore 33 and illustrate groove 74 from mounting portion 67, undercut portions 81–82, and the lateral elongation of bore 33 between central strip 46 and sidewalls 42 or 43. As illustrated in FIG. 1, bores 33 extend longitudinally along sidewalls 42–43 with mounting portions 67 of contact means 65 being disposed adjacent to sidewalls 42–43 with active portions 66 of opposed contacts inwardly disposed from their mounting portions 67 in opposite lateral directions.

Figure 9:
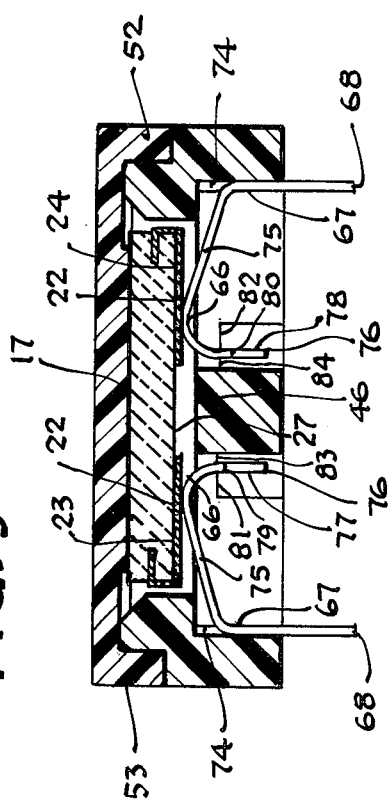
FIG. 9 is an end view of cross-section similar to FIG. 7 except that the integrated circuit package is illustrated in final mounted position on the connector.

In the completed assembly 10 illustrated in FIG. 2 and in cross-section in FIG. 9, face 32 of connector means 14 is in juxtaposition to rearwardly directed major surface 18 of package 12 with a plurality of active portions 66 in pressure engagement with pads 22. Holding means as illustrated by cover means 31 hold package 12 in connector 14 and maintain the pressure engagement. As illustrated, central projection 19 is exposed by cover opening 49 and permits both cooling and identification of projection 19. Guiding sidewalls 52–53 of cover means 31 are laterally positioned outwardly from sidewalls 42–43 and are in juxtaposition above shoulders 56–57.

As illustrated in FIG. 9, biasing means provided by shoulders 79–80 after rearward movement of active portion 66 no longer abut undercut portions 81–82 and have been laterally moved towards ends 83–84 after wiping action by active portion 66 on pads 22.

Figure 11:
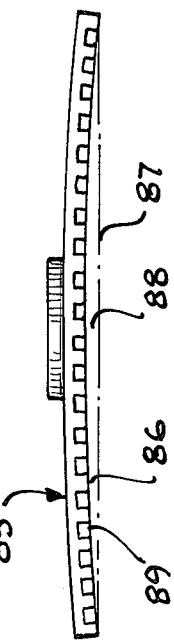
FIG. 11 is a side view of the integrated circuit package of FIG. 1 illustrating the bowing effect on the package.

FIG. 11 illustrates the permanent distortion exhibited by many integrated circuit packages 85 wherein rearwardly directed major surface 86 is distorted so as to deviate slightly from a planar surface 87 a maximum distance 88 measured normal to planar surface 87. As a result of this distortion, conductive pads 89 are separated varying distances from surface 87. In respect to the distortion of major surface 86, it is not uncommon for distance 88 to be in the order of 0.012 inches for a 2 inch long package. Since active portions 66 are frontwardly disposed from front face 32 a length greater than maximum distance 88 rearward movement of pads 89 against active portions 66 develops a pressure engagement between active portion 66 and pads 89 although the separation between active portion 66 and front face 32 varies according to the separation between pads 89 and front face 32. In this manner, effective pressure engagement is provided between pads 89 and active portions 66 and in addition, active portions 66 provide at least partial support for package 85.

The foregoing description of the present invention is only illustrative of an exemplary form which the invention may take. Still, other modifications and variations will suggest themselves to persons skilled in the art. It is intended, therefore, that the foregoing detailed description be considered as exemplary only and that the scope of the invention be ascertained from the following claims.

I claim:

1. An electrical connector for receiving a flat integrated circuit package having a thin, fragile body with a rearwardly directed major surface and a plurality of thin conductive pads arranged longitudinally along opposite sides of said major surface, said connector comprising insulating base means including a cavity with a front face for receiving in juxtaposition said major surface in an electrically connecting position, the front face including opposite longitudinal side surfaces and a plurality of contact-receiving bores arranged in a row along each of said side surfaces and extending rearwardly into the base means,
   a plurality of metallic contact means including mounting portions fixedly positioned in said bores of said base means, rearwardly disposed terminal portions for electrical connection to external conductors, free-ended, frontwardly-facing active portions disposed frontwardly a distance from said side surfaces over said bores and below said pads for pressure-developing engagement with said pads when said major surface is moved rearwardly into said cavity to said electrically connecting position, and further arranged for lateral movement to provide a wiping action on said pads, and elongated cantilever spring means extending along portions of said side surfaces and interconnecting said mounting and active portions for developing said pressure,
   biasing means including means on said contact means and base means for resiliently restraining said active portions frontwardly from free, forward positioning with respect to said front face, restraining means on said base means and cooperating with said body for restraining said major surface and pads against lateral displacement during said lateral movement of said active portions against said pads, polarizing means disposed on the base means and arranged for receiving the package in a predetermined orientation, and holding means fastenable to the base means and engageable with said body for holding said pads rearwardly in pressure engagement against said active portions after rearward movement of said package into said cavity and into said electrically connecting position.

2. The connector of claim 1 wherein said holding means includes an insulating cover means having a first end hingeably connected to said base means and a second end including releasably fastening means for fastening to said base means.

3. The connector of claim 1 wherein said biasing means includes at least one frontwardly positioned shoulder on said contact means and a corresponding undercut portion in said bore for engagement with said shoulder.

4. The connector of claim 3 wherein said restraining means includes pins on said front face engageable with corresponding apertures in said major surface.

5. The connector of claim 4 wherein said pins are of unequal size and also serve as said polarizing means.

6. The connector of claim 2 wherein said cover means includes opposite longitudinal sides with rearwardly extending guide rails and said base means includes longitudinal sidewalls and recesses outwardly adjacent said sidewalls for receiving said guide rails.

7. An electrical connector for receiving a flat integrated circuit package having a thin, fragile body with a rearwardly directed major surface and a plurality of thin conductive pads arranged longitudinally along opposite sides of said major surface, said connector comprising insulating base means including walls forming a cavity and a front face in said cavity for receiving in juxtaposition said major surface in an electrically connecting position, the front face including opposite longitudinal side surfaces and a plurality of contact-receiving bores elongated laterally and arranged in a row along each of said side surfaces and extending rearwardly into the base means,
   a plurality of metallic contact means including mounting portions fixedly positioned in said bores of said base means, rearwardly disposed terminal portions for electrical connection to external conductors, free-ended, frontwardly facing active portions disposed frontwardly a distance from said side surfaces below said pads for pressure-developing engagement with said pads when said major surface is moved rearwardly into said cavity to said electrically connecting position, and elongated cantilever spring means extending along portions of said side surfaces and interconnecting said mounting and active portions for developing said pressure, and cantilever spring means also extending frontwardly to effect a lateral movement of said active portions for wiping action on said pads with the wiping action of the active portions in each of said rows being oppositely directed,
   biasing means disposed at the free ends of said active portions rearwardly below said major surface and resisliently restraining said active portions frontwardly from free, forward positioning with respect to said front face, said biasing means including at least one frontwardly positioned shoulder on said contact means and a corresponding undercut portion in said bore for engagement with said shoulder, restraining means on said base means and cooperating with said body for restraining said major surface and pads against lateral displacement during said lateral movement of said active portions against said pads, said restraining means including pins on said front face engageable with corresponding apertures in said major surface, and holding means interconnected to the base means and engageable with said body for holding said pads rearwardly in pressure engagement against said active portions after rearward movement of said package into said cavity and into said electrically connecting position, said holding means including an insulating cover means having a first end hingeably connected to said base means and a second end including releasable fastening means for fastening to said base means.

8. The connector of claim 7 wherein said pins are of unequal size and serve as polarizing means.

9. The connector of claim 8 wherein said cover means includes opposite longitudinal sides with rearwardly extending guide rails and said base means includes longitudinal sidewalls and recesses outwardly adjacent said sidewalls for receiving said guide rails.

10. The connector of claim 8 wherein said mounting portions of said contact means are fixably positioned in said base means outwardly from said active portions, said active portions being arranged to provide essentially uniform pressure along the length of said body, and said cantilever spring means enabling said active portions to move rearwardly and laterally during rearward movement of said pads.

11. The connector of claim 7, wherein said side surfaces are separated by a central strip and said cantilever spring means in each row of contact means extend in opposite lateral directions and are in juxtaposition with said central strip.

* * * * *

UNITED STATES PATENT OFFICE
CERTIFICATE OF CORRECTION

Patent No. 3,953,101         Dated April 27, 1976

Inventor(s)  Vincent James Palecek

It is certified that error appears in the above-identified patent and that said Letters Patent are hereby corrected as shown below:

Column 4, line 32, "suface" should read -- surface --.

Column 5, line 19, "50" should read -- 59 --; line 64, "catilever" should read -- cantilever --.

Column 6, line 8, "incldues" should read -- includes --; line 10, after "pressure" insert -- developed --; line 27, "75" should read -- 76 --.

Signed and Sealed this

Twenty-fifth Day of January 1977

[SEAL]

Attest:

RUTH C. MASON  
*Attesting Officer*

C. MARSHALL DANN  
*Commissioner of Patents and Trademarks*